United States Patent [19]

Stenning

[11] 3,968,448

[45] July 6, 1976

[54] ELECTRICAL FILTERS

[75] Inventor: Luis Charles Stenning, Beaconsfield, England

[73] Assignee: The General Electric Company Limited

[22] Filed: Oct. 10, 1974

[21] Appl. No.: 513,778

[30] Foreign Application Priority Data

Oct. 17, 1973 United Kingdom............... 48445/73

[52] U.S. Cl................................. 328/167; 328/109; 328/149; 328/162; 328/165

[51] Int. Cl.[2]........................ H03B 1/00; H03B 1/04; H03K 5/00; H04B 1/10

[58] Field of Search ........... 328/167, 165, 162, 109, 328/149; 333/70 T

[56] References Cited

UNITED STATES PATENTS

| | | | |
|---|---|---|---|
| 2,760,011 | 8/1956 | Berry | 333/70 T |
| 2,908,812 | 10/1959 | Laurent | 328/165 |
| 3,081,434 | 3/1963 | Sandberg | 328/167 X |
| 3,237,111 | 2/1966 | Coates, Jr. et al. | 328/165 X |
| 3,659,229 | 4/1972 | Milton | 333/70 T |
| 3,810,067 | 5/1974 | Heidecker | 328/167 |

OTHER PUBLICATIONS

"Analysis and Synthesis of Delay Line Periodic Filters," by Urkowitz, The Transactions on Circuit Theory; CT-4, No. 2, June 1957, pp. 41–53.

*Primary Examiner*—Saxfield Chatmon, Jr.
*Attorney, Agent, or Firm*—Kirschstein, Kirschstein, Ottinger & Frank

[57] ABSTRACT

An electrical filter for extracting from an applied input signal a pseudo-random sequence signal contained in the input signal comprises: an analogue delay line; means for applying to the input of the delay line an input signal containing the pseudo-random sequence signal; feedback means for producing a feedback signal in response to the signals appearing at two or more points along the length of the delay line; and combining means for combining said feedback signal with said input signal; said feedback means being constructed in dependence on said pseudo-random sequence so that, at the input of the delay line, said pseudo-random signal in said input signal is reinforced by said feedback signal.

4 Claims, 1 Drawing Figure

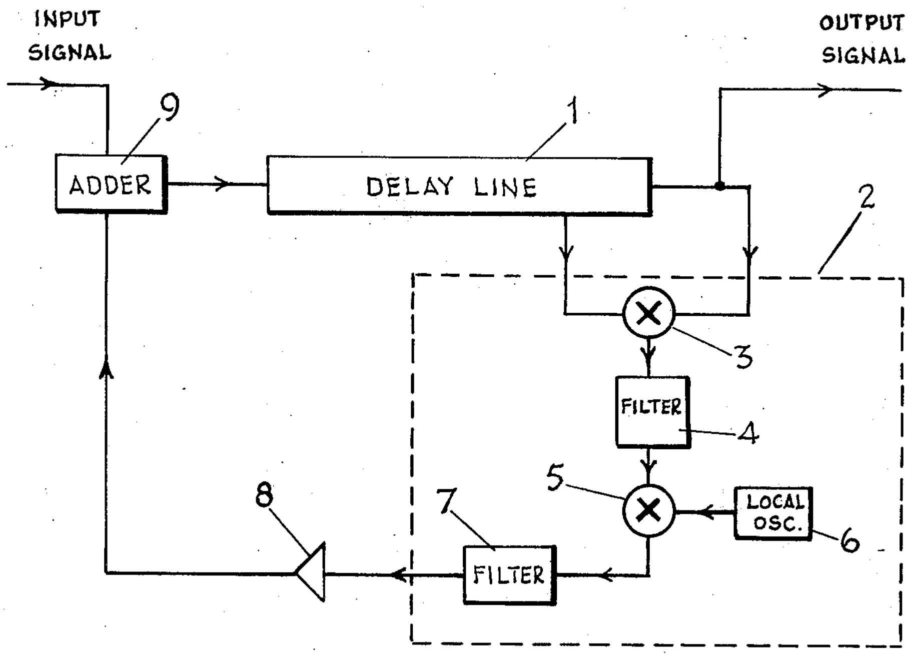
INPUT SIGNAL
OUTPUT SIGNAL
9
ADDER
1
DELAY LINE
2
3
FILTER
4
5
LOCAL OSC.
6
8
7
FILTER

ELECTRICAL FILTERS

This invention relates to electrical filters.

It is an object of the present invention to provide a novel form of electrical filter which is capable of extracting from an applied input signal a pseudo-random sequence signal contained in the input signal.

According to the present invention there is provided an electric filter comprising: an analogue delay line; means for applying to the input of the delay line an input signal containing a pseudo-random sequence signal; feedback means for producing a feedback signal in response to the signals appearing at two or more points along the length of the delay line; and combining means for combining said feedback signal with said input signal; and feedback means being constructed in dependence on said pseudo-random sequence so that, at the input of the delay line, said pseudo-random signal in said input signal is reinforced by said feedback signal.

In an arrangement in accordance with the invention the analogue delay line suitably comprises an acoustic surface wave delay line.

One arrangement in accordance with the invention will now be described, by way of example, with reference to the accompanying drawing which is a block schematic diagram of the arrangement.

Referring to the drawing, the arrangement includes an acoustic surface wave delay line 1 of known form. The delay line, comprises a slab of monocrystalline quartz which carries on one main face an input transducer which in response to an applied electrical signal causes a corresponding acoustic surface wave to propagate across the surface of the slab, by virtue of the piezoelectric effect. Along the path of the propagated acoustic surface wave there are disposed two or more output transducers, each of which produces, by virtue of the piezoelectric effect, an electrical output signal corresponding to the input signal, but delayed in time by an amount corresponding to the physical spacing of that output transducer from the input transducer. Each of the output transducers thus constitutes a tapping point along the length of the delay line.

Each transducer comprises two metal layer electrodes, each of which electrodes comprises a set of fingers interdigitated with the fingers of the other electrode, each set of fingers extending from a respective metallised area which serves as a terminal for external connection of the transducer. The number of fingers and their width and spacing is chosen in dependence on the centre frequency and bandwidth of the signals which the delay line is required to pass.

Delay lines of the form described have been described for example, in an article entitled "Surface Acoustic Wave Devices" by M. F. Lewis appearing at pages 156 to 162 of Volume 39 No. 4 of the GEC Journal of Science and Technology; and in an article entitled "Tapping Microwave Acoustics for Better Signal Processing" by L. Altman appearing at pages 94 to 96 of the Nov. 10, 1972 issue (Vol. 42, No. 23) issue of Electronics.

The electrical signals produced at the output transducers are fed to circuits 2 where they are combined to produce a feedback signal. The circuits 2 are constructed, and in particular positions of the output transducers along the delay line are chosen, so that if the feedback signal produced was fed to the input of the delay line in combination with a unmodulated alternating current signal a desired pseudo-random sequence of phase-reversals would appear in the signal at the output of the delay line 1. In this respect the delay line 1 and the circuits 2 are analogous to a known form of pseudo-random binary sequence generator comprising a multi-stage shift register whose input is the output of an exclusive OR gate logic circuit arrangement fed from, say, the last stage and one other stage of the register. Such generators are described in a book entitled "Error Correcting Codes" by W. W. Peterson published jointly by The M.I.T. Press and John Wiley and Sons Inc. In the present arrangement, since the delay line propagates an alternating current signal rather than a digital signal, the circuits 2 are arranged to produce a signal at the frequency of the signal in the delay line and of a particular phase or the reverse phase according to whether the signals at the tapping points on the delay line are in-phase or anti-phase. Furthermore, since the arrangement is analogue, the amplitude of the feedback signal is dependent on the amplitudes of the signals at the tapping points on the delay line.

In a typical arrangement wherein the delay line has two tapping points, the circuits 2 incorporate a circuit 3 for combining the signals at the tapping points by multiplication to produce a required output signal of frequency $2f$ where $f$ is the frequency of the signal propagating along the delay line. This output signal is selected by a filter 4 and converted to a frequency of $f$ with the aid of a mixer circuit 5, a local oscillator 6 of frequency $3f$ and a filter 7.

The output of the circuits 2 is fed via an amplifier 8 to one input of a linear adder 9 whose output is fed to the input of the delay line 1, the amplifier 8 serving to maintain the loop gain of the arrangement just below unity. If necessary, means may be provided for maintaining the loop phase shift at a fixed integral number of cycles.

In operation of the arrangement an input signal is applied to a second input of the adder 9. If the input signal contains a pseudo-random sequence-modulated signal which conforms with the desired pseudo-random signal which would be produced by the arrangement when operated as a pseudo-random signal generator, then the two signals applied to the adder 9 add coherently. Conversely, any non-conformal signal or noise at the second input of the adder 9 adds incoherently to the feedback signal. Hence, when the desired pseudo-random signal is present in the signal applied to the second input of the adder 9, the desired signal is consistently reinforced whilst all other signals are not. Consequently, the signal-to-noise ratio of the desired signal at the output of the delay line 1 gradually rises causing the desired signal to predominate at the delay line output eventually. In theory this will occur however small the signal-to-noise ratio of the desired signal at the second input of the adder 9, but in practice, the signal-to-noise ratio of the desired signal must be greater than a certain finite value for the arrangement to work.

It will be appreciated that whilst in the arrangement described above, by way of example, the signal is modulated in phase only, in other arrangements another parameter of the signal may be modulated additionally or alternatively, for example, amplitude.

Furthermore, the analogue delay line in an arrangement in accordance with the invention is not necessarily an acoustic surface wave delay line. Thus in an alternative arrangement the delay line may suitably comprise a charge transfer device. Such devices and their use as analogue delay line devices are described in an article entitled "Charge Transfer Devices" by M. F. Tompsett appearing at pages 1166 to 1181 of the July-August 1972 issue (Volume 9 No. 4) of the Journal of Vacuum Science and Technology. A charge transfer delay line device requires an applied clock signal to progress a signal through it, and when used in an arrangement in accordance with the invention this clock signal has to be synchronized with the sequence frequency of the pseudo-random sequence signal in the input signal of the arrangement.

An arrangement in accordance with the invention finds particular application in signalling systems, i.e. communication systems and radar systems, wherein the transmitted signal is subjected to a coding process in dependence on a pseudo-random sequence signal generated at the transmitter to reduce the possibility of interception and/or jamming of the transmitted signal. In such a system, in order to decode the transmitted signal at a receiver a knowledge of the pseudo-random sequence signal used for coding is necessary. By use of a filter arrangement in accordance with the present invention the desired pseudo-random sequence signal may be extracted from a received signal in which the signal-to-noise ratio of the pseudo-random sequence signal is so low as to render its presence virtually undetectable by potential interceptors and jammers.

In one particular such application a filter arrangement in accordance with the invention is used at a receiver to extract a low-signal to noise ratio pseudo-random sequence signal from a received signal which is transmitted as a preamble to a further transmitted signal which contains data to be communicated by the system in an encoded form which requires a knowledge of the pseudo-random sequence for decoding to be possible. After extraction of the pseudo-random signal from the preamble signal by the filter arrangement, the receiver can immediately be synchronised with the data signal which follows.

Decoding of the data may be done in conventional manner or may be done by further use of the filter arrangement to provide the required pseudo-random sequence signal.

I claim:

1. An electric filter comprising:

A. an analogue delay line;

B. means for applying to the input of the delay line an input signal containing a pseudo-random sequence signal;

C. feedback means for producing a feedback signal in response to the signals appearing at two or more points along the length of the delay line; and D. combining means for combining said feedback signal with said input signal;

E. the positions of said points along the length of the delay line being so phase related to said pseudo-random sequence signal and F. said feedback means being so constructed in dependence on said pseudo-random sequence that, at the input of the delay line, said pseudo-random signal in said input signal is reinforced by said feedback signal while all the other signals are not.

2. An electric filter according to claim 1 wherein said delay line comprises an acoustic surface wave delay line.

3. An electric filter according to claim 2 wherein said input signal contains an alternating current signal whose phase is modulated in accordance with said pseudo-random sequence and said feedback means produces a feedback signal at the frequency of said alternating current signal and of a phase dependent on the relative phases of the signals produced at said points along the length of the delay line in response to the application of said alternating current signal to the input of the delay line.

4. An electrical filter according to claim 3 wherein said feedback means comprises a multiplying circuit to which the signals at said points along te delay are applied; filter means for selecting a signal at a multiple of the frequency of said alternating current signal from the output of the multiplying circuit, and frequency changing means for converting the output signal of the filter to the frequency of said alternating current signal.

* * * * *